United States Patent

Shao et al.

[11] Patent Number: 6,154,057
[45] Date of Patent: Nov. 28, 2000

[54] BI-DIRECTIONAL VOLTAGE TRANSLATOR

[75] Inventors: Shuyong Shao, Boca Raton; Hung Vuong, Margate; Charles Browder, Boca Raton; Christine Purcell, Plantation, all of Fla.

[73] Assignee: Motorola, Inc., Schaumburg, Ill.

[21] Appl. No.: 09/340,232

[22] Filed: Jul. 1, 1999

Related U.S. Application Data

[60] Provisional application No. 60/111,169, Dec. 7, 1998.
[51] Int. Cl.$^7$ .............................................. H03K 19/0175
[52] U.S. Cl. .............................................. 326/63; 326/80
[58] Field of Search .......................................... 326/63, 80

[56] References Cited

U.S. PATENT DOCUMENTS 5,017,800  5/1991  Divan ........................................ 307/66
5,680,063  10/1997  Ludwig et al. ........................... 326/80

*Primary Examiner*—David Nelms
*Assistant Examiner*—M. Tran
*Attorney, Agent, or Firm*—Andrew S. Fuller

[57] ABSTRACT

A bi-directional voltage translator (125) has a first port (201) that communicates a signal at a first voltage level, and second port (202) that communicates a signal at a second voltage level different from the first voltage level. A switching circuit, including a bipolar junction transistor (210) and a switch (220), couples both ports (201, 202). The transistor (210) has a collector (211) coupled, via a pull-up circuit (206), to a voltage source corresponding to the first voltage level, and to the first port (201), and an emitter (212) coupled to the second port. The base (213) of the transistor (210) is coupled, via a pull-up circuit (207), to a voltage source corresponding to the second voltage level. Preferably, the switch (220) is Schottky diode or other diode having a forward voltage drop.

11 Claims, 2 Drawing Sheets

6,154,057

BI-DIRECTIONAL VOLTAGE TRANSLATOR

CROSS REFERENCE

This application claims the benefits of U.S. Provisional Application No. 60/111,169 filed Dec. 7, 1998 and assigned to Motorola, Inc.

TECHNICAL FIELD

This invention relates in general to electrical interfaces for electronic devices, and more particularly, to bi-directional voltage translators for use in such devices and for other purposes.

BACKGROUND OF THE INVENTION

Electronic devices such as radio telephones, two-way radios, and other communication devices, often have an externally accessible connector for interfacing with compatible accessories. Generally, an accessory is designed to operate at a voltage level that is compatible with the voltage level of the electronic device. However, as electronic devices are being designed to operate at lower voltage levels to reduce power consumption requirements or for other purposes, it is desirable to have electronic devices that can interface with accessories designed to operate at different voltage levels. Such flexibility would allow for protection of investments in accessory inventories which may benefit customers and manufacturers alike.

In one solution to the above described problem, a bi-directional voltage translator is provided at the external interface of the electronic device. A prior art application of such a bidirectional voltage translator is described in U.S. Pat. No. 5,680,063 issue to Ludwig et al., on Oct. 21, 1997, for a BI-DIRECTIONAL VOLTAGE TRANSLATOR, the entire contents of which are hereby incorporated by reference. Here, Ludwig describes a switch circuit in which a field effect transistor (FET) device is used to provide a switch circuit for low power applications, i.e., three volts (3V) to five volts (5V) voltage translation. For particular circuit implementations, Ludwig postulated that certain devices were unsuitable for low power application. As an example, at column 7, lines 36–39, Ludwig states that "in low power applications, such as 3V to 5V voltage translation, it is envisioned that the use of BJTs rather than MOSFETs may retard or altogether prevent turn-on of [the] switch circuit."

Ludwig's circuit implementation has been found to be unsuitable for certain low voltage applications, particularly as electronic devices transition from 5 volts to 3 volts to 1.8 volts or lower. Other prior art solutions that use control lines to direct signal flow and voltage translation tend to be more complex. Accordingly, the need exists for a bidirectional voltage translator that is suitable for such low voltage applications, but that avoids the complexity involved with additional control lines.

DETAILED DESCRIPTION OF THE PREFERRED EMBODIMENT

Figure 1:
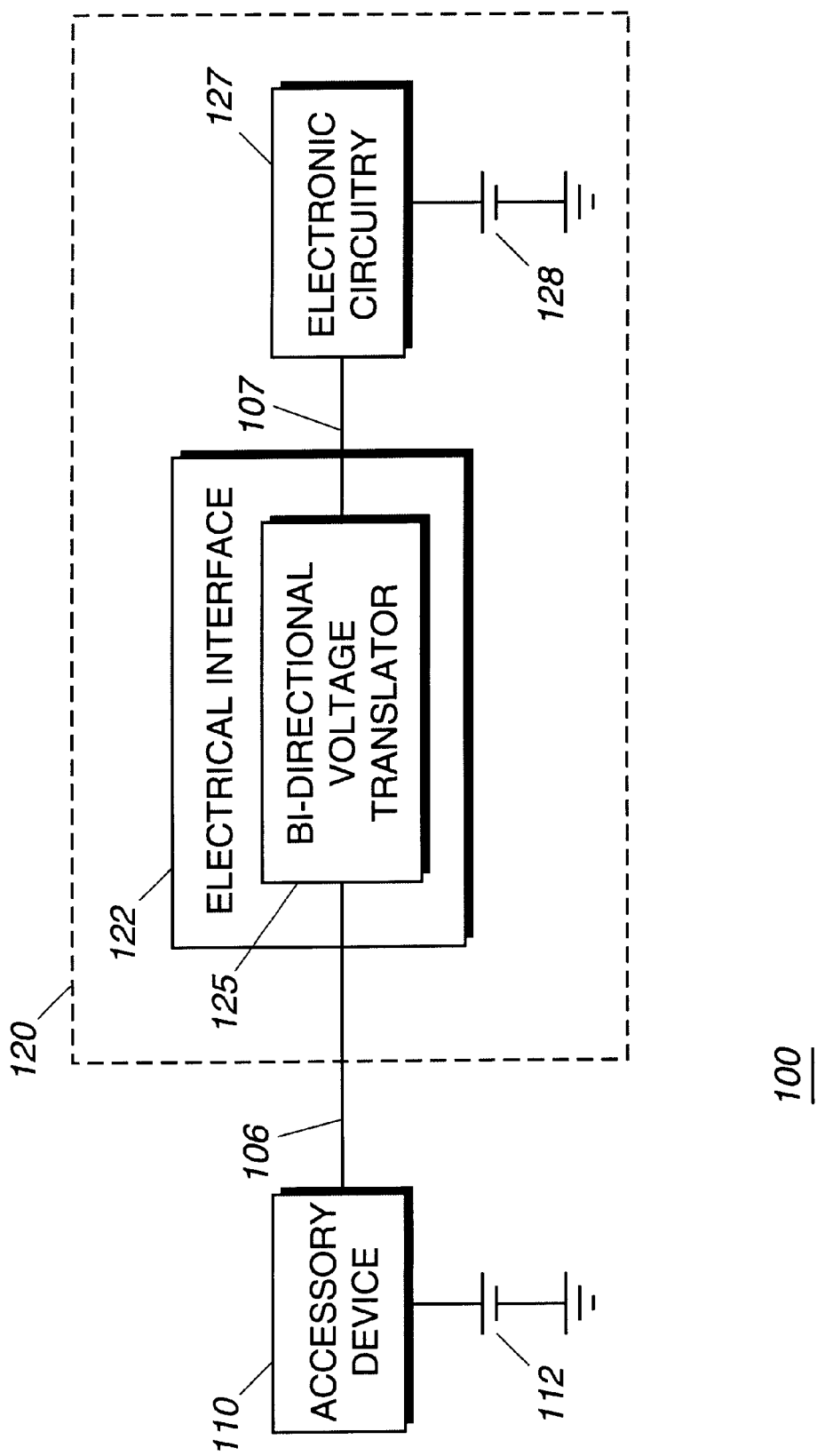
FIG. 1 is a block diagram of electronic devices having an electrical interface therebetween that employs a bidirectional voltage translator, in accordance with the present invention.

While the specification concludes with claims defining the features of the invention that are regarded as novel, it is believed that the invention will be better understood from a consideration of the following description in conjunction with the drawing figures, in which like reference numerals are carried forward.

The present invention provides for a voltage translator, suitable for low voltage applications, that allows for bi-directional signal flow across an interface of signals at different voltage levels at either side of the interface. The voltage translator has a first port that communicates a signal at a first voltage level, and second port that communicates a signal at a second voltage level different from the first voltage level. A switching circuit that includes a bipolar junction transistor is used to transfer signals having a particular voltage level at one port to signals of a different voltage level at the other port. The transistor has one of its emitter and collector terminals coupled, via a pull-up circuit, to a voltage source corresponding to the first voltage level, and to the first port, and the other of its emitter and collector terminals coupled to the second port. The base of the transistor is coupled, via a pull-up circuit, to a voltage source corresponding to the second voltage level. Preferably, a diode having a forward voltage drop of at most 0.3 volts is used to coupled the first and second ports to support the transfer of low level signal between ports.

FIG. 1 illustrates an electronic apparatus 100 that includes a bi-directional voltage translator 125, in accordance with the present invention. The electronic apparatus 100 includes an electronic accessory device 110 that is coupled to an electronic device 120 through a signal bus 106 via an external interface. In the preferred environment, the electronic device 120 is a radio communication device, such as a radio telephone, two-way radio, or the like. The accessory device operates at a first voltage level, such as five volts (5V), provided by a first energy source 112 coupled thereto, and the electronic device 120 has electronic circuitry 127 that operates at a second voltage level, such as three volts (3V), provided by an internal energy source 128. The electronic device 120 has an externally accessible connector or electrical interface 122 that includes a bidirectional voltage translator 125. The voltage translator 125 allows for communication of signals on signal line 106 at a first voltage level and for communication of signals on signal line 107 at a second voltage level different from the first voltage level. Electronic circuitry 127 is coupled to the electrical interface 122 via signal line 107 and processes communication signals going to and coming from the accessory device 110.

Figure 2:
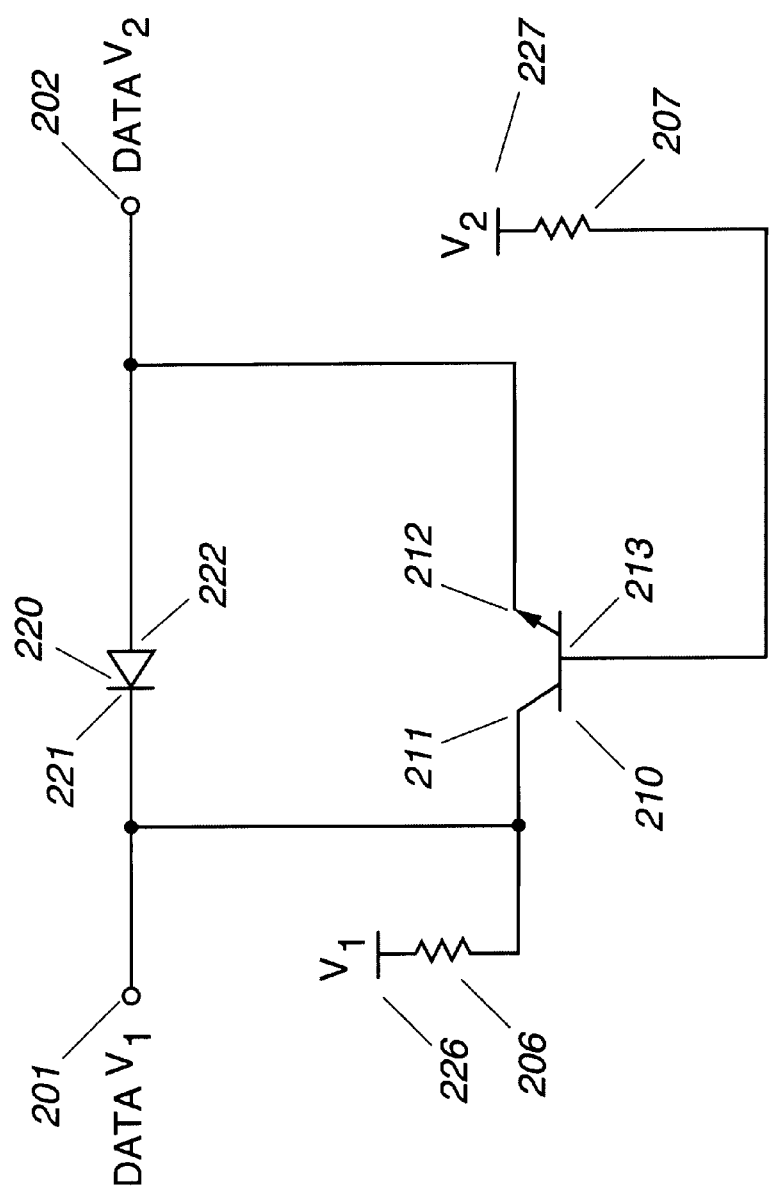
FIG. 2 is a schematic diagram of one embodiment of a bi-directional voltage translator, in accordance with the present invention.

FIG. 2 is a schematic diagram of the voltage translator 125, in accordance with the present invention. The voltage translator 125 has a first port 201 and a second port 202. At the first port, signals are communicated at a first voltage level, $V_1$. At the second port 202, signals are communicated at a second voltage level, $V_2$, lower than or otherwise different from $V_1$. Typical values for $V_1$ to $V_2$ translation are 7.5V to 3V, 5V to 3V, 5V to 2.7V, and 2.7V to 1.8V. Those skilled in the art would appreciate that these are but examples, and that other translations are contemplated.

The voltage translator 125 comprises a switch circuit, including an NPN bipolar junction transistor 210 and a switch in the form of a diode 220, that couples the first port 201 to the second port 202. The bipolar junction transistor 210 has a collector electrically connected to the first port 201 and a emitter 212 electrically connected to the second port 202. The transistor 210 has a base 213 electrical connected, via a pull-up circuit 207, to a voltage source 227, corresponding to the voltage level $V_2$ of the second port 202. The collector 211 of the transistor 210 is also electrically connected, via a pull-up circuit 206, to a voltage source 226, corresponding to the voltage level $V_1$ of the first port 201. The pull-up circuits 206, 207 comprise high impedance elements, particularly, large value resistors, with values preferably between 10,000 and 100,000 ohms. The diode 220 is preferably a Schottky diode having its cathode electrically connected or coupled to the first port 201 and having its anode 222 electrically connected to the second port 202. The Schottky diode is particularly useful because its forward voltage drop is approximately 0.2 to 0.3 volts.

Operation of the described circuitry can be illustrated by considering an example in which 5V to 3V voltage translation is needed, i.e., where $V_1$ is 5V and $V_2$ is 3V. When a 5V (high-level) signal is applied at the first port 201, the transistor 210 will conduct, and a 0.7 V drop develops across the base 213 and the emitter 212, generating a 2.6 V signal at the emitter 212. A 2.6 V signal ordinarily meets a specification for high level complementary-symmetry metal-oxide semiconductor (CMOS) input,. Nevertheless, a 3V pull-up resistor (not shown) can be added at the emitter to help bring the signal up to 3V. When a 0V (low-level) signal is applied to the first port 201, the Schottky diode 220 will conduct, and the voltage at the second port 202 will be approximately 0.3 V.

When a high level signal (3V) is applied at the second port 202, neither the transistor 210 nor the diode 220 conducts, and pull-up circuit 206 brings the collector up to 5V. Rise time of the 5V signal can be adjusted through proper selection of resistor 206. With a low-level signal (0V) is applied to the second port 202, the transistor 210 goes into saturation, and there is a very small voltage drop across the collector 211 and emitter 212. Consequently, the collector 211 and thus the first port will be set to approximately 0 volts. The value of the resistor 207 can be set to give the proper low-level voltage at the collector.

The circuit can be used to translate different voltages through proper selection of the appropriate resistor values. Note that no control lines are required to translate the signals. The circuit will translate automatically as the signals change state.

The present invention provides significant advantages over the prior art. A voltage translator, as described herein, may be included in an electrical interface of an electronic device to allow the use of accessories designed to operate at a voltage level different from that of the electronic device. This facilitates the migration of products to lower voltages, such as for power consumption reduction purposes, while still maintaining interface compatibility with higher voltage devices. The combination of the Schottky diode and the bipolar transistor allows the voltage translator to work particularly well for low voltage applications, and is superior to the use of field effect transistors (FETs) in such applications. Particularly, the forward voltage of the Schottky diode (0.2–0.3V) is substantially lower than the 0.6V typically associated with the internal diode equivalent in FETs. This factor allows for more reliable operations at 3V. At 2.7V, 1.8V, or lower, the typical gate to source conducting voltage (2V) of FETs, compared with the 0.6V base to emitter conducting voltage of a bipolar transistor, makes the FET unsuitable for applications below 2 volts. Moreover, the voltage translator of the present invention is suitable for use circuits having a pull-down resistor at the lower voltage port, unlike prior art translators that use FETs.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A bi-directional voltage translator, comprising:
   a first port that communicates a signal at a first voltage level;
   a second port that communicates a signal at a second voltage level different from the first voltage level, wherein the second voltage level is at most 2.7 volts;
   a switch circuit coupling the first port to the second port, the switch circuit comprising:
      a switch coupling the first port to the second port; and
      a bipolar junction transistor having a base, an emitter, and a collector, the base being coupled, via a pull-up circuit, to a voltage source corresponding to the second voltage level, the collector being coupled, via a pull-up circuit, to a voltage source corresponding to the first voltage level, the emitter being coupled to the second port and the collector being coupled to the first port.

2. The bi-directional voltage translator of claim 1, wherein the switch comprises a diode having a forward voltage drop of at most 0.3 volts.

3. The bidirectional voltage translator of claim 1, wherein:
   the first voltage level is higher than the second voltage level; and
   the switch comprises a Schottky diode having a cathode connected to the first port and an anode connected to the second port.

4. The bi-directional voltage translator of claim 1, wherein the second voltage level is at most 1.8 volts.

5. A bi-directional voltage translator, comprising:
   a first port to communicate a first signal at a first voltage level;
   a second port to communicate a second signal at a second voltage level different from the first voltage level;
   a bipolar junction transistor device having a base, an emitter, and a collector, the emitter being coupled to one of the first port and the second port, the collector being coupled to another of the first port and the second port, wherein the bipolar junction transistor device is responsive to the first signal at the first voltage level to generate the second signal at the first voltage level, and is responsive to the second signal at the second voltage level to generate the first signal at the first voltage level; and
   a Schottky diode having an anode coupled to the second port and a cathode coupled to the first port, wherein the first voltage level is higher than the second voltage level.

6. The bi-directional voltage translator of claim 5, further comprising a first pull-up circuit coupled to the first port and coupled to a voltage source corresponding to the first voltage level.

7. The bi-directional voltage translator of claim 6, further comprising a second pull-up circuit coupled to the base, and coupled to a voltage source corresponding to the second voltage level.

8. An apparatus, comprising:
   a first electronic device;
   an electrical interface, integral to the first electronic device, for detachably coupling a second electronic device, the electrical interface including a bidirectional voltage translator comprising:

a first port to communicate a first signal at a first voltage level;

a second port to communicate a second signal at a second voltage level lower than the first voltage level;

a Schottky diode having an anode coupled to the second port and a cathode coupled to the first port; and a bipolar junction transistor device having a base, an emitter, and a collector, the emitter being coupled to one of the first port and the second port, the collector being coupled to another of the first port and the second port, wherein the bipolar junction transistor device is responsive to the first signal at the first voltage level to generate the second signal at the first voltage level, and is responsive to the second signal at the second voltage level to generate the first signal at the first voltage level.

9. The apparatus of claim 8, further comprising:

a first pull-up circuit coupled to the first port, and coupled to a voltage source corresponding to the first voltage level; and a second pull-up circuit coupled to the base, and coupled to a voltage source corresponding to the second voltage level.

10. The apparatus of claim 9, wherein the second voltage level is at most 2.7 volts.

11. The apparatus of claim 9, wherein the second voltage level is at most 1.8 volts.

* * * * *